(12) United States Patent
Slight et al.

(10) Patent No.: US 10,903,140 B2
(45) Date of Patent: Jan. 26, 2021

(54) BI-DIRECTIONAL HEATSINK DAMPENING FORCE SYSTEM

(71) Applicant: Cisco Technology, Inc., San Jose, CA (US)

(72) Inventors: Phil Slight, Mount Hermon, CA (US); Vic Chia, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/384,494

(22) Filed: Apr. 15, 2019

(65) Prior Publication Data

US 2019/0244877 A1  Aug. 8, 2019

Related U.S. Application Data

(63) Continuation of application No. 15/421,709, filed on Feb. 1, 2017, now Pat. No. 10,262,919.

(51) Int. Cl.
| | |
|---|---|
| *H05K 7/20* | (2006.01) |
| *H01L 23/40* | (2006.01) |
| *H05K 1/02* | (2006.01) |

(52) U.S. Cl.
CPC ....... *H01L 23/4006* (2013.01); *H05K 1/0209* (2013.01); *H01L 2023/4062* (2013.01); *H01L 2023/4081* (2013.01); *H01L 2023/4087* (2013.01); *H05K 1/0203* (2013.01); *H05K 7/2049* (2013.01); *H05K 2201/066* (2013.01); *H05K 2201/10242* (2013.01); *H05K 2201/10265* (2013.01); *H05K 2201/10393* (2013.01); *H05K 2201/10409* (2013.01)

(58) Field of Classification Search
CPC ............... H05K 7/2049; H05K 1/0203; H05K 2201/066; H05K 2201/10393; H05K 2201/10409; H01L 23/40–4006; H01L 2023/4043; H01L 2023/405; H01L 2023/4062; H01L 2023/4081; H01L 2023/4087
USPC ......... 361/709, 719; 165/80.3; 257/718–719; 411/107, 353; 248/220.21, 222.2, 222.14, 248/560
See application file for complete search history.

(56) References Cited

U.S. PATENT DOCUMENTS

| | | |
|---|---|---|
| 5,754,400 A | 5/1998 | Sathe |
| 6,243,264 B1 | 6/2001 | Bollesen et al. |
| 6,249,436 B1 | 6/2001 | Bollesen |
| 6,501,658 B2 * | 12/2002 | Pearson ............... H01L 23/4093 174/16.3 |
| 7,321,493 B2 | 1/2008 | Liang et al. |
| 7,323,358 B1 | 1/2008 | Cromwell |
| 7,405,939 B2 | 7/2008 | Yang |
| 7,583,504 B2 | 9/2009 | Aberg |
| 7,777,329 B2 | 8/2010 | Colbert et al. |

(Continued)

*Primary Examiner* — Zachary Pape
(74) *Attorney, Agent, or Firm* — Polsinelli PC (57) ABSTRACT

A circuit board includes a heatsink configured to be coupled to the circuit board via a first coupling mechanism, the first coupling mechanism providing an asymmetrical downward force for coupling the heatsink to the circuit board. The circuit board further includes a second coupling mechanism configured to provide a counter force to the asymmetrical downward force of the first coupling mechanism. The counter force can be configured on an overhang portion of the heatsink that does not cover a circuit on the circuit board.

20 Claims, 4 Drawing Sheets

(56) References Cited

U.S. PATENT DOCUMENTS

| | | | |
|---|---|---|---|
| 9,615,483 B2* | 4/2017 | Chawla | .................... H05K 7/20 |
| 10,262,919 B2* | 4/2019 | Slight | ................. H01L 23/4006 |
| 2005/0057907 A1* | 3/2005 | Meyer | ................. H05K 7/1053 |
| | | | 361/785 |
| 2006/0202325 A1* | 9/2006 | Coico | ................. H01L 23/4006 |
| | | | 257/718 |
| 2006/0232928 A1* | 10/2006 | Vinson | ...................... G06F 1/20 |
| | | | 361/679.52 |
| 2014/0313674 A1* | 10/2014 | Guan | ................. H01L 23/4006 |
| | | | 361/709 |

* cited by examiner

FIG. 4 ded to the circuit board and is suspended in a balanced state thus preventing any structural deformation of the heatsink and allowing the heatsink to pass shock and vibration tests.

BI-DIRECTIONAL HEATSINK DAMPENING FORCE SYSTEM

CROSS-REFERENCE TO RELATED APPLICATIONS

This application is a continuation of U.S. application Ser. No. 15/421,709, filed on Feb. 1, 2017, the content of which is incorporated herein by reference in its entirety.

TECHNICAL FIELD

The present technology pertains to coupling of heatsinks for cooling electronic components in an electro-mechanical system and maintaining a balance of such coupled heatsinks in order to prevent the heatsinks from experiencing any form of structural deformation or reshaping.

BACKGROUND

On a given circuit board that may have one or more electronic components installed thereon (e.g., an Application Specific Integrated Circuit (ASIC)), heatsinks are mounted for cooling such electronic components. Typically, a heatsink is coupled to the underlying circuit board to cover an underlying electronic component symmetrically so as to cause a uniform downward force of the heatsink to spread evenly across the electronic component for optimal heat transfer. In doing so, locations of mounting holes for mounting the heatsink over the underlying electronic component are as close to the underlying electronic component as possible to provide even localized pressure and prevent bowing of the base of the heatsink, which if occurs causes Ball Grid Array (BGA) cracking. In other words, a heatsink typically has a symmetrical layout relative to the underlying electronic component once coupled to the circuit board. Therefore, the heatsink is balanced and does not experience any structural deformation or reshaping.

As power of such electronic components increases, heatsinks to be utilized also grow in size, shape and complexity. For example, such increase in size and shape results in a heatsink that has an asymmetrical layout relative to the underlying electronic component, resulting in the heatsink having an unbalanced (overhang) portion. When a heatsink is attached to the circuit board using an attachment component, the downward force created by a portion of screws that couple the unbalanced portion of the heatsink to the printed circuit board results in deformation of the heatsink (due to for example the cantilever effect), a decrease in thermal efficiency of the heatsink due to potential bowing effect occurring at the base of the heatsink and failure of the heatsink in passing shock and vibration testing.

BRIEF DESCRIPTION OF THE FIGURES

In order to describe the manner in which the above-recited and other advantages and features of the disclosure can be obtained, a more particular description of the principles briefly described above will be rendered by reference to specific embodiments that are illustrated in the appended drawings. Understanding that these drawings depict only example embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Overview

As described above in the Background Section, as a size, shape and complexity of a heatsink increases in order to adequately cool an underlying electronic component, the heatsink may have an asymmetrical (unbalanced) layout relative to the underlying electronic component. Accordingly, the uneven and unbalanced downward coupling force resulting from the coupling of the heatsink to the underlying circuit board may be such that the unbalanced portion (and ultimately the entirety) of the heatsink will eventually experience a structural deformation due to the cantilever effect or the bowing of the base of the heatsink. The structural deformation can in turn decrease the thermal efficiency of the heatsink and prevent it from passing shock and vibration testing.

The present application describes several embodiments, according to which the downward coupling force described above is countered such that the heatsink having the asymmetrical layout is coupled to the circuit board and is suspended in a balanced state thus preventing any structural deformation of the heatsink and allowing the heatsink to pass shock and vibration tests.

In another aspect, the disclosure describes a circuit board that includes a heatsink coupled to the circuit board via a first coupling mechanism and a second coupling mechanism. The first coupling mechanism creates an asymmetrical downward force for coupling the heatsink to the circuit board and the second coupling mechanism provides a counter force to the asymmetrical downward force of the first coupling mechanism in order to maintain the heatsink suspended in an equilibrium state.

In one aspect, the disclosure describes a circuit board that includes an integrated circuit (IC), a heatsink coupled to the IC, the heatsink including a first portion covering the IC and a second portion extending beyond an edge of the IC. The second portion can be also characterized as an overhang portion of the heatsink. The circuit board includes a coupling mechanism configured to (1) couple the second portion of the heatsink to the circuit board and (2) provide bi-directionally equal forces to prevent the heatsink from being structurally deformed.

Description

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Detailed illustrative embodiments are disclosed herein. However, specific structural and functional details disclosed herein are merely representative for purposes of describing example embodiments. This invention may, however, be embodied in many alternate forms and should not be construed as limited to only the embodiments set forth herein.

Accordingly, while embodiments are capable of various modifications and alternative forms, the embodiments are shown by way of example in the drawings and will be described herein in detail. It should be understood, however, that there is no intent to limit embodiments to the particular forms disclosed. On the contrary, embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of embodiments. However, it will be understood by one of ordinary skill in the art that embodiments may be practiced without these specific details. For example, systems may be shown in block diagrams so as not to obscure the embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs), computers or the like.

Figure 1:
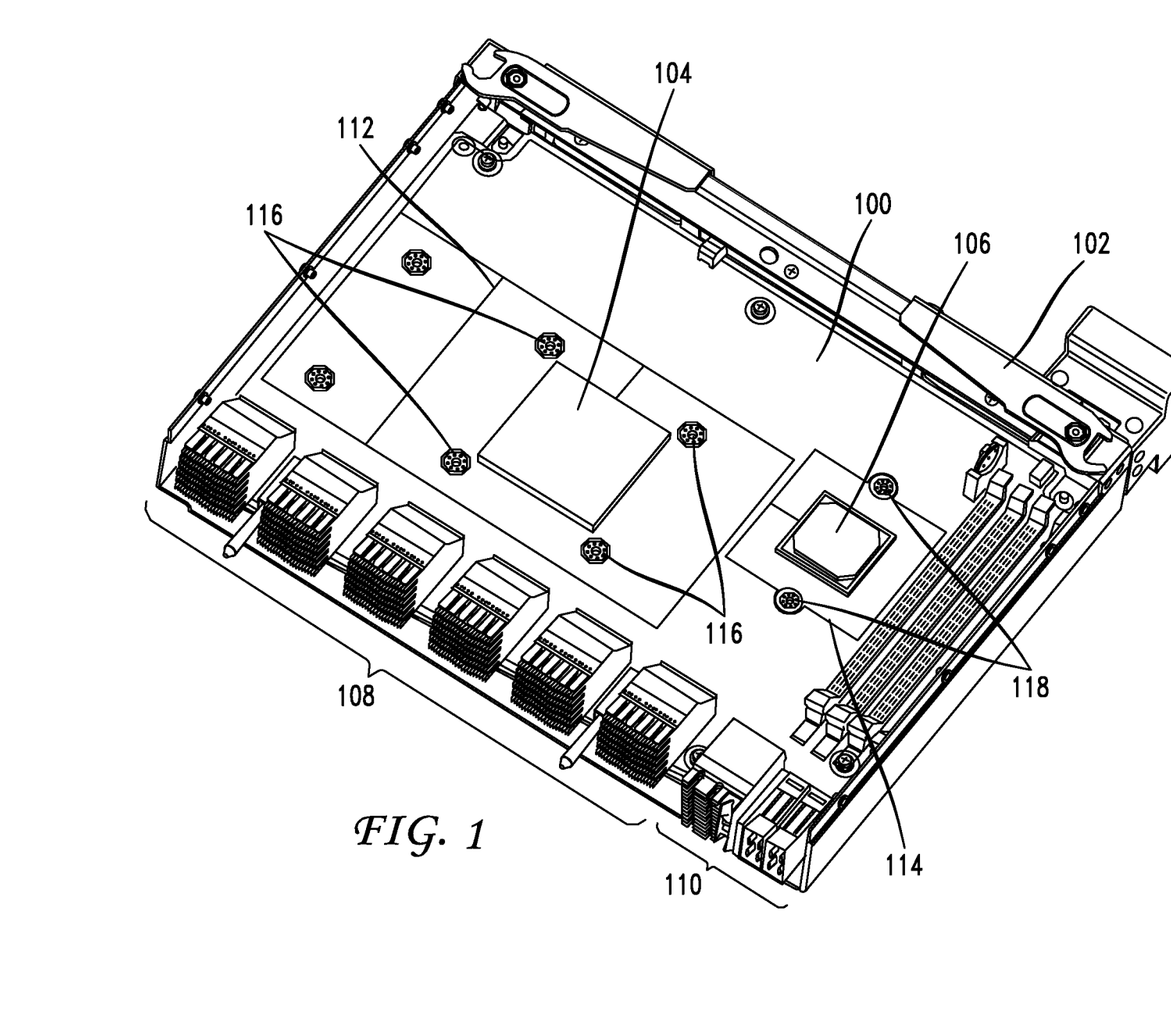
FIG. 1 illustrates a circuit board, according to various embodiments.

FIG. 1 illustrates a circuit board, according to various embodiments. As shown in FIG. 1, the circuit board 100 (e.g., a printed circuit board), can be any type of conductive platform/board for installing and electrically connecting various electrical and mechanical components thereon in order to construct an electrical circuit. The resulting circuit can have many known, or to be developed uses, functionalities and configurations for utilization in various electronic and/or mechanical systems including, but not limited to, computers, laptops, handheld devices, mobile phones, modems, routers, home appliances, etc.

The circuit board 100 can be securely positioned in a housing 102. The housing 102 can be plastic or metal. However, example embodiments are not limited to plastic or metal housings.

The circuit board 100 has one or more electronic chips installed thereon such as the application specific integrated circuit (ASIC) 104 and 106. While ASICs are being discussed hereinafter as an example of electronic chips installed on the circuit board 100, inventive concepts are not limited thereto. Accordingly, any known or to be developed electronic component/integrated circuit (IC) that can be installed on a circuit board and requires cooling can be used in place of or in conjunction with the ASICs 104 and 106.

The circuit board 100, in addition to the ASICs 104 and 106, can have additional electrical and/or mechanical components installed thereon. For example, the circuit board 100 can have one or more connection ports 108 installed thereon (e.g., when the circuit board 100 is built and configured to be used in a modem or a router) for connection to external devices, local area networks, telephone lines, etc. The circuit board 100 can also have additional input/output components such as ports 110 for powering the operation of various electrical components installed on the printed circuit board 100.

Additional components that can be installed on the circuit board 100 are not limited to that described above with reference to FIG. 1 (e.g., the connection ports 108, 110 and or additional components depicted as being installed on the circuit board 100 in FIG. 1). Accordingly, in addition to the ASICs 104 and 106 as examples of electronic chips and corresponding heatsinks that can be installed thereon (as will be described below), the types of additional components that are installed on the circuit board 100 depend on the application of the electronic circuit that is built using the circuit board 100.

Accordingly, identification, operation and inter-operability of such additional components are not necessary for purposes of describing and conveying inventive concepts of the present disclosure. As such, a discussion of specific examples of such components is not included for sake of brevity. However, it is noted that an aspect of the present disclosure and associated embodiments is that the circuit board 100 has one or more electronic components (e.g., such as ASICs 104 and 106 and/or any general purpose integrated circuit (IC), electronic microchip, etc.), and corresponding heatsinks for cooling thereof, installed on the circuit board 100.

As briefly mentioned above, the ASICs 104 and 106 can each have a heatsink installed thereon. While such heatsinks will be illustrated and further discussed with reference to FIGS. 2-4 below, FIG. 1 illustrates outlines 112 and 114, which assist in envisioning that once such heatsinks are installed over the ASICs 104 and 106, the heatsinks occupy an area over each of the ASICs 104 and 106, as defined by the outlines 112 and 114. Furthermore, such heatsinks can be coupled to the circuit board 100 using various known, or to be developed coupling mechanism/components such as spring loaded screws. Attachment locations 116 and 118 indicate example locations at which each such heatsink is coupled to the circuit board 100. An example of a spring loaded screw can include: a cylindrical rod, a clip configured to hold the cylindrical rod at a first portion thereof extending above a base of the heatsink and prevent a separation of the at least one second coupling component from the heatsink and a spring encompassing a second portion of the cylindrical rod extending below the base of the heatsink and configured to generate the upward force.

If conventional heatsinks are used, the outlines 112 and 114 indicate that once such heatsinks are installed over the ASICs 104 and 106, the heatsinks would be symmetrically positioned relative to the underlying ASICs 104 and 106. Furthermore, the attachment locations 116 and 118 are symmetrical relative to the corresponding one of the ASICs 104 and 106 and as discussed above are as close to the ASICs 104 and 106 as possible. As such, the downward coupling force (downward force) created due to the coupling of the heatsinks to the circuit board 100, would be evenly distributed over the corresponding one of the ASICs 104 and 106, which in turn prevents the heatsinks from undergoing any structural deformation and allows for optimal heat transfer. However, the even distribution of such downward force would not be possible if the heatsinks have an asymmetrical layout relative to the underlying ASICs 104 and 106 and are coupled to the circuit board 100 at attachment locations 116 and 118, as shown. In some cases, a heatsink will be asymmetrical in that there is a portion of the heatsink that does not cover the underlying ASICs 104, 106.

Figure 2:
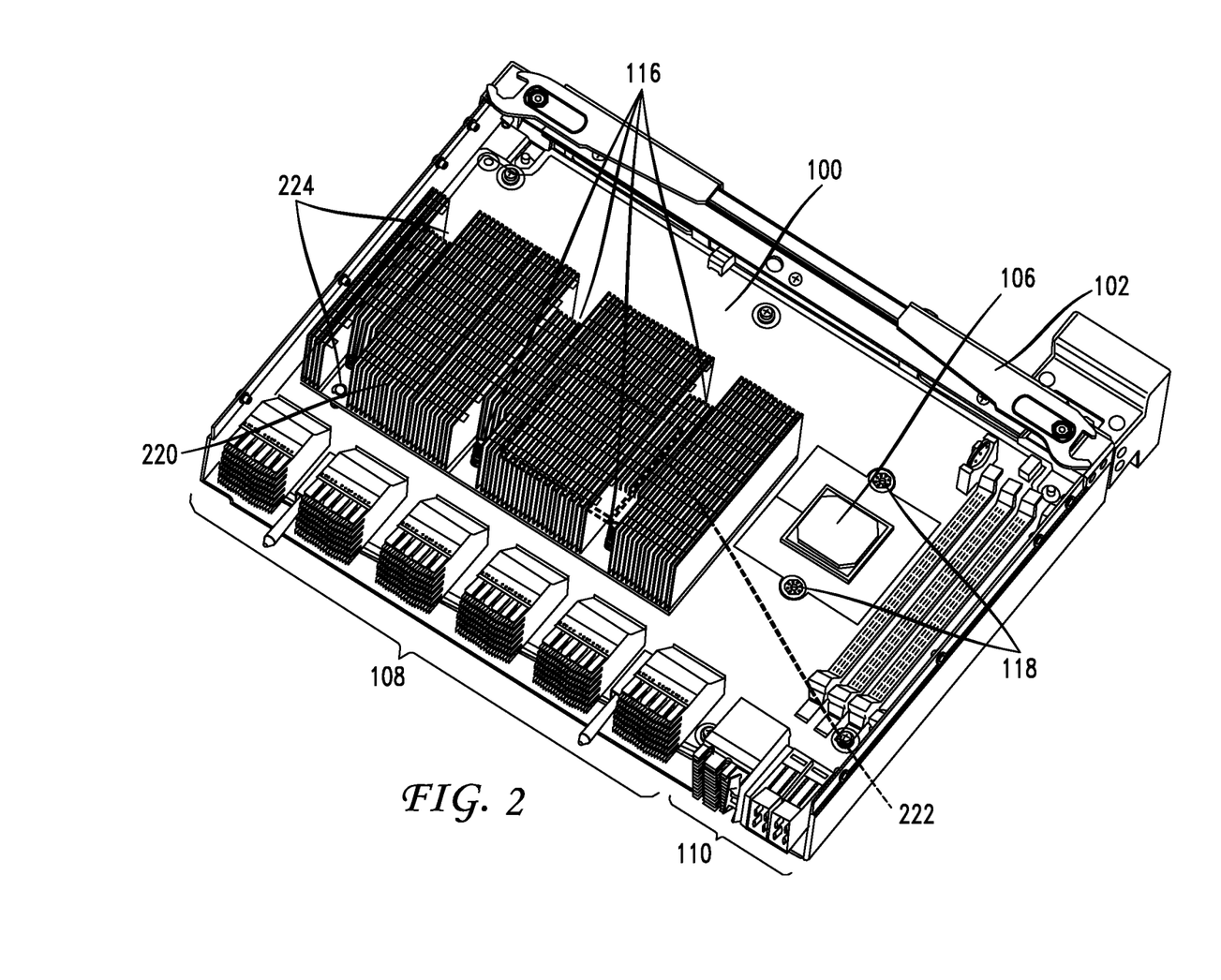
FIG. 2 illustrates the circuit board of FIG. 1 with a heatsink coupled thereto, according to various embodiments.

FIG. 2 illustrates the circuit board of FIG. 1 with a heatsink coupled thereto, according to various embodiments. The circuit board of FIG. 2 is the same as that of FIG. 1 with the addition of heatsink 220. Accordingly and for the sake of brevity, elements of FIG. 2 which are the same as elements/components described above with reference to FIG. 1 are similarly numbered and will not be further described.

According to FIG. 2, the heatsink 220 is installed on the ASIC 104. However, because the ASIC 104 is no longer visible in FIG. 2 due to the presence of the heatsink 220, an outline 222 is provided to indicate the location of the ASIC 104 underneath the heatsink 220.

As discussed above, due to the ever changing complexities/power requirements of ASICs and thus the ever changing requirements for cooling such ASICs, heatsinks can grow in size and complexity as well so that when coupled to the circuit board 100, the heatsinks are no longer symmetrical relative to the underlying ASICs. The heatsink 220 is an example of one such heatsink. Accordingly, the heatsink 220 can be coupled to the circuit board 100 at attachment points 116 as well as two additional attachment points 224. This issue addressed by the present disclosure is how to couple the heatsink 220 that has an overhang portion that does not directly cover the ASIC. More specifically, the present disclosure provides an improved coupling mechanism for the overhang portion of heatsink 220.

Considering FIGS. 1 and 2 together, one can image that if the heatsink 220 is installed over the ASIC 104 for cooling the ASIC 104, then the heatsink 220 will neither be symmetrically positioned relative to the ASIC 104 nor the attachment points 116 together with the two additional attachment points 224 allow for an even distribution of the load (downward force of the load) of the heatsink 220 over the ASIC 104 for optimal heat transfer.

Figure 3:
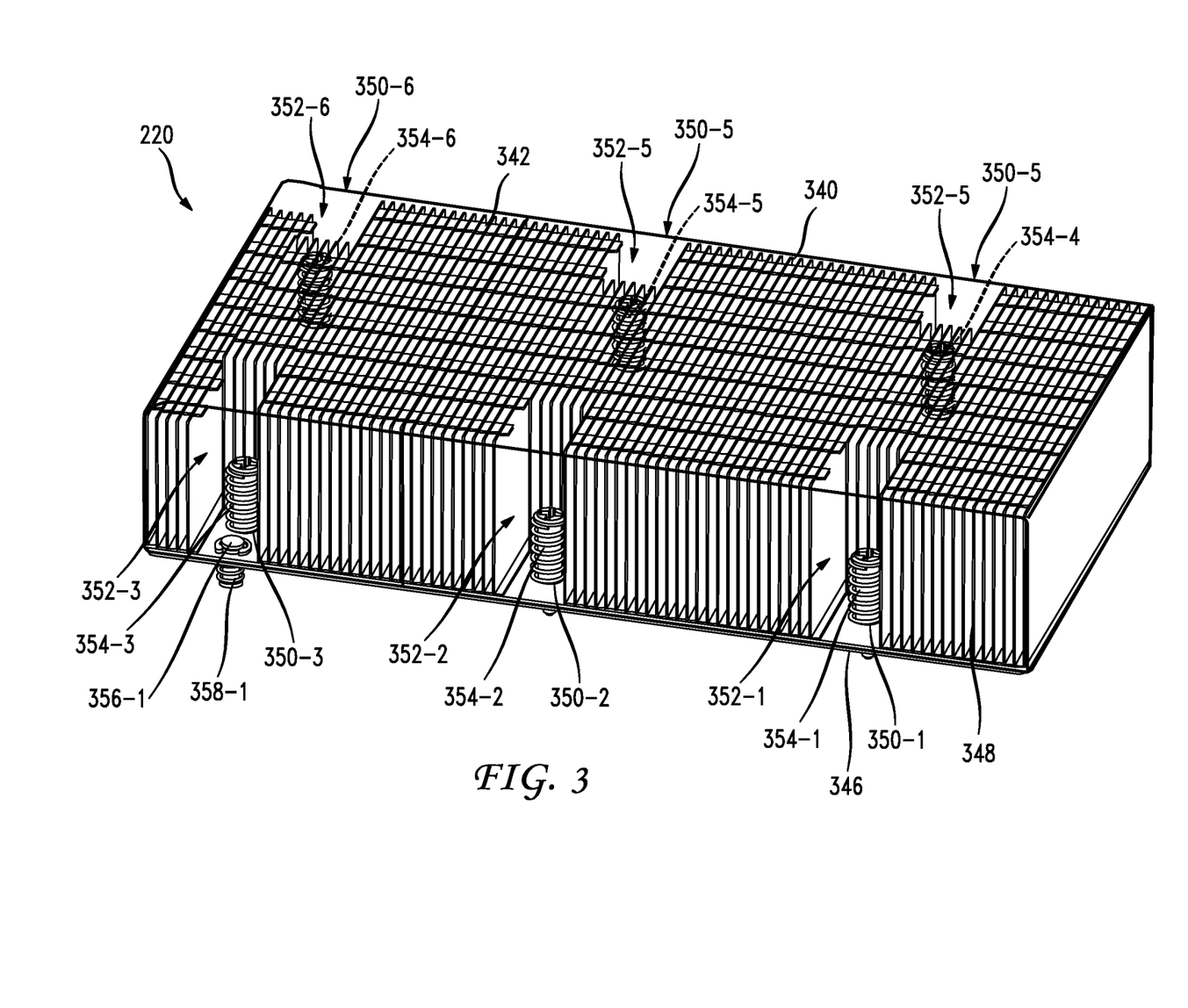
FIG. 3 is an enlarged view of the heatsink of FIG. 2, according to various embodiments.

FIG. 3 is an enlarged view of the heatsink of FIG. 2, according to various embodiments. The heatsink 300 can be conceptually divided into and considered as having two portions 340 and 342. If the heatsink 220 was to include only the portion 340, then the heatsink 220 would be the same as the heatsinks discussed above having an evenly distributed load over the ASIC 104. Accordingly, the portion 340 can also be referred to as the symmetrical portion 340 of the heatsink 220.

However, the existence of the portion 342 (which is necessitated by the design constraints and the required complexities for cooling the underlying ASIC 104), results in the entirety of the heatsink 220 to be asymmetrical relative to the underlying ASIC 104, once coupled to the circuit board 100. Accordingly, the portion 342 can also be referred to as the asymmetrical portion 342 or the overhang portion 342.

Furthermore, the heatsink 220 has a base 346 and a body 348. The base 346 has openings 350-1, 350-2 and 350-3 shown on the front side of the heatsink 220. While not shown in FIG. 3, the base 346 has an equal number of openings on the rear side of the heatsink 220 as pointed to using reference numerals 350-4 to 350-6. Comparing FIGS. 1, 2 and 3, the openings 350-1, 350-2, 350-4 and 350-5 correspond to the attachment points 116 in FIG. 2 while openings 350-3 and 350-6 correspond to the attachment points 118 in FIG. 2.

Above each of the openings 350-1 to 350-6, a portion of the body 348 of the heatsink 220 is carved out to create an empty space for ease of access to the opening (e.g., for insertion, control and/or removal of coupling components). These openings are shown as hollow vertical rectangular cubes above each opening and are identified using reference numerals 352-1 through 352-6 in FIG. 3. However, the exact shape of the hollow sections 352-1 to 352-6 is not limited to a vertical rectangular cube but can be any other shape of form.

Furthermore, FIG. 3 illustrates coupling components 354-1 to 354-3, each of which is inserted into each of the openings 350-1 to 350-3, respectively. Similar coupling components 354-4 to 354-6 are provided and inserted into each of the openings 350-3 to 350-6 on the rear side of the heatsink 220 for coupling the heatsink 220 to the circuit board 100. Each coupling component 354-1 to 354-3 penetrates downward through the corresponding one of the openings 350-1 to 350-3 and is attached to the circuit board 100 to couple the heatsink 220 to the circuit board 100. Similarly, coupling components 354-4 to 354-6 penetrate the openings 350-4 to 350-6 on the rear side of the heatsink 220 to couple the heatsink 220 to the circuit board 100. The coupling components 354-1 to 354-6 can be any one of, but is not limited to, a spring loaded screw, a spring loaded plunger, an omega spring clip, a rubber grommet, etc.

Once the heatsink 220 is coupled to the circuit board 100, the asymmetrical portion 342 extends beyond an edge of the underlying ASIC 104 parallel to the circuit board 100. In other words, the asymmetrical portion 342 extends out beyond the edge of the ASIC 104 parallel to the circuit board 100. As a result, an empty space is created between the asymmetrical portion 342 and the circuit board 100.

Coupling components used to couple (attach) the heatsink 220 to the circuit board 100 create a downward coupling force (where the downward direction is defined as a direction from the heatsink 220 to the circuit board 100) that prevents the heatsink 220 from being separated from the circuit board 100. As described above, if the heatsink 220 includes only the symmetrical portion 340, then due to the symmetrical configuration of the heatsink 220 and the attachment locations 116 relative to the ASIC 104, the downward coupling force is evenly distributed over the ASIC 104 and thus prevents the heatsink 220 from being deformed (e.g., bent at the base of the heatsink 105) and allows for optimal heat transfer.

However, with the heatsink 220 having the configuration shown in FIG. 3, the downward coupling is no longer symmetrical relative to the ASIC 104. In one embodiment, the coupling component 354-3 and the coupling component 354-6 on the opposite side (rear side) of the heatsink 220 create a partial downward force that contributes to the creation of the asymmetrical downward coupling force (asymmetrical downward force) and thus can be referred to as the asymmetrical coupling components 354-3 and 354-6. Therefore, the heatsink 220 may be deformed (e.g., at the asymmetrical portion 342) due to the cantilever effect, the base 346 of the heatsink 220 may be deformed to the bowing effect and the heatsink 220 may not pass shock and vibration tests. The potential deformation of the heatsink 220 can prevent an optimal heat transfer from the underlying ASIC 104.

In an embodiment and in order to counter the asymmetrical downward coupling force created due to the asymmetrical layout of the heatsink 220 over the ASIC 104, one or more coupling components can be provided to counter the downward force of the asymmetrical coupling components 354-3 and 354-6. Because such coupling component(s) provides a force equal and counter (a counter force) to the portion of the asymmetrical downward force created by the asymmetrical coupling components 354-3 and 354-6, such coupling component(s) may be referred to as reverse coupling component(s). In one aspect, the disclosure describes a circuit board that includes an integrated circuit (IC), a heatsink 220 coupled to the IC, the heatsink 220 including a first portion covering the IC and a second portion extending beyond an edge of the IC. The second portion can be also characterized as an overhang portion of the heatsink. The circuit board includes a coupling mechanism configured to (1) couple the second portion of the heatsink to the circuit board and (2) provide bi-directionally equal forces to prevent the heatsink from being structurally deformed.

As shown in FIG. 3, an opening 356-1 is provided adjacent to the opening 350-3 in order to accommodate the reverse coupling component 358-1. Accordingly, the reverse coupling component 358-1 penetrates upward through the opening 356-1 and attaches to the base 346 for coupling the heatsink 220 to the circuit board 100. In an embodiment, the upward coupling force provided by the reverse coupling component 358-1 is equal and opposite to the portion of the asymmetrical downward force created by the coupling component 354-3. Furthermore, while in FIG. 3, the opening 356-1 for the reverse coupling component 358-1 is provided closer to the edge of the base 346 relative to the opening 350-3, the position of the openings 350-3 and 356-1 can be switched, such that the opening 356-1 is located behind the opening 350-3 relative to the edge of the base 346.

A similar opening and reverse coupling component (e.g., would be opening 356-2 and reverse coupling component 358-2) can also be provided on the rear side of the heatsink 220. Such opening and reverse coupling component can be situated relative to the opening 350-6 in a similar manner as the opening 356-1 and the reverse coupling component 358-2). Accordingly, each of the reverse coupling component 358-1 and would be reverse coupling component 358-2 creates a portion of the upward coupling force that is equal and counter to the portion of the asymmetrical downward force (asymmetrical downward coupling force) created by the asymmetrical coupling component 354-3 and/or the asymmetrical coupling component 354-6.

In an embodiment, a number of openings and corresponding reverse coupling components correspond to the number of openings and asymmetrical coupling components used for coupling the heatsink 220 to the circuit board 100. In other words, there may be a one to one correspondence between the asymmetrical coupling component(s) and the reverse coupling components.

In an embodiment, there may not be a one to one correspondence between the asymmetrical coupling components and reverse coupling components, such that for example, for every two asymmetrical coupling components, a single reverse coupling component is provided. Accordingly, the reverse/upward coupling force created by such single reverse coupling component may be equal to the combined downward coupling force created by the corresponding two asymmetrical coupling components.

In another embodiment, there can be a many to one correspondence between the asymmetrical coupling components and a single reverse coupling component. For example, instead of providing the opening 356-1 and the corresponding reverse coupling component 358-1 close to an edge of the base 346 as shown in FIG. 3 (and a similar opening and reverse coupling component on the rear side of the heatsink 220), only a single opening and reverse coupling component is provided (e.g., in the middle of the base 346) such that the single reverse coupling component creates sufficient upward force to be equal and counter to the combined downward coupling force created by the asymmetrical coupling components 354-3 and the similar coupling component (354-6) on the rear side of the heatsink 220. In one embodiment, the central location of such opening and reverse coupling component can be at an equal distance from all of the openings 350-1 to 350-6, an equal distance from the openings 350-3 and 350-6 on the rear side of the heatsink 220 or a center of the heatsink 220. Thus, the position of one or more reverse coupling component can vary to any position on the heatsink 220, including the overhang portion as well as any other portion of the heatsink 220.

The coupling components and reverse coupling components described above can be the same or different and can be any type of known or to be developed coupling component, fasteners, screws, etc., including but not limited to, a spring loaded screw, a spring loaded plunger, an omega spring clip, a rubber grommet, etc.

In an embodiment, a combination of coupling components that create the downward coupling force (e.g., coupling components 354-1 to 354-6) can be collectively referred to as the downward coupling mechanism or the first coupling mechanism. Similarly a combination of any number of reverse coupling components used for countering the asymmetrical downward coupling force of the downward coupling mechanism may be referred to as upward coupling mechanism, a reverse coupling mechanism and/or a second coupling mechanism.

Figure 4:
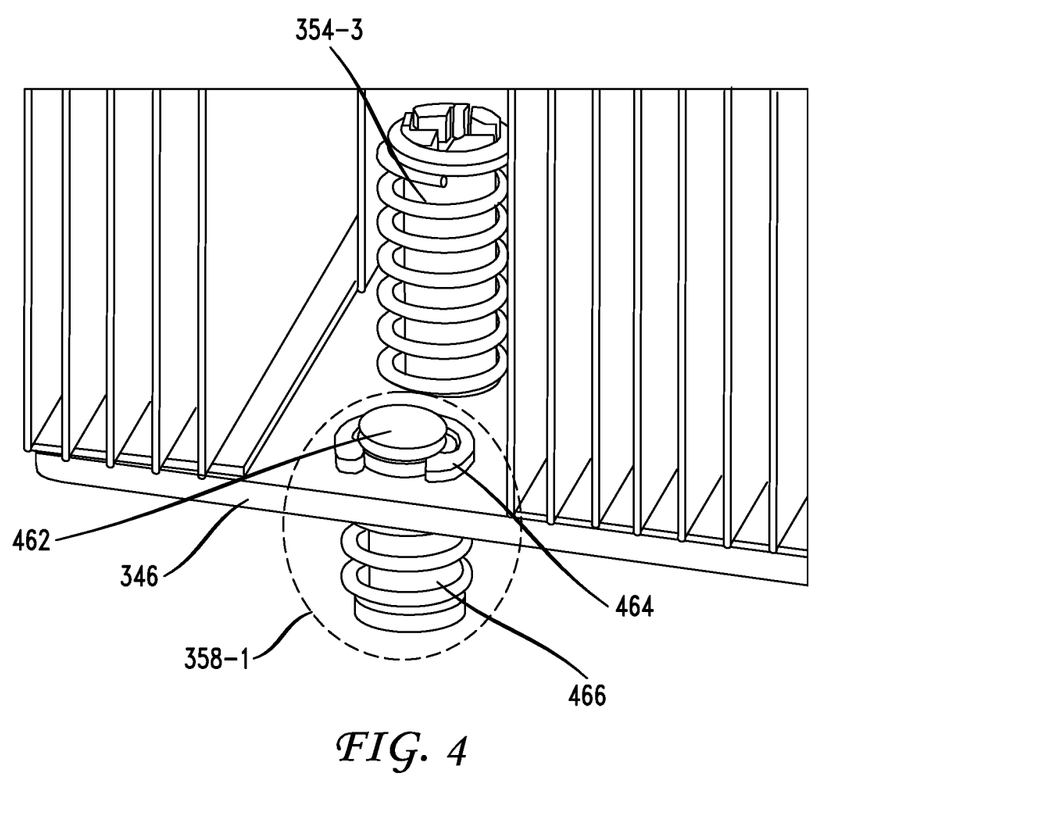
FIG. 4 illustrates components of a reverse coupling component, according to various embodiments.

FIG. 4 illustrates components of a reverse coupling component, according to various embodiments. As shown in FIG. 4, the reverse coupling component 358-1 can be a spring loaded plunger that includes a rod 462, which can be made of any type of material including, but not limited to, metal, plastic, etc. The reverse coupling component 358-1 further includes a clip 464 (e.g., a c-clip) attached to an upper portion of the rod 462 that extends above the top surface of the base 346 in order to hold the rod 462 and prevent a separation of the rod 462 from the base 346. The reverse coupling component 358-1 further includes a spring 466 attached to and encompassing the lower portion of the rod 462 below the base 346. The spring 466 can be a spring that is capable of creating sufficient upward coupling force for countering the downward coupling force created by the asymmetrical coupling component(s) (e.g., the force created by the spring 466 of coupling component 354-3). While the reverse coupling component 358-1 is described as a spring loaded plunger in FIG. 4, as described above, the reverse coupling component 358-1 is not limited thereto.

While the coupling components 354-1 to 354-6 are shown as having a cylindrical shape, inventive concepts are not limited thereto and such coupling components can have any know or to be developed shape or form. For example, a coupling component can be a cylindrical rod.

Examples of inventive concepts described with reference to FIGS. 1-4 enable installing and maintaining any type of heatsink, regardless of size, shape, complexity and positioning thereof relative to an underlying chip and/or ASIC, in an equilibrium state. This would in turn allow the heatsink 220 to pass shock and vibration tests, prevent any structural deformation of the heatsink 220 due to cantilever and/or bowing effects and finally allows for optimal heat transfer.

While one or more examples of the structure of the heatsink 220 (including the number of coupling means, openings, etc.) is described with reference to FIG. 3, it should be noted that inventive concepts are not limited thereto and the heatsink 220 can take on various configurations, structures including various number of openings, coupling means, etc., that once installed over an ASIC or a chip result in an asymmetrical and uneven load distribution and downward coupling force created relative to the underlying ASIC or chip. It is also noted that depending on a position and configuration of a reverse coupling component, that the configuration of the heat dissipation elements of the heatsink 220 can also be modified to accommodate a particular location for one or more reverse coupling components.

Devices implementing methods according to these disclosures can comprise hardware, firmware and/or software, and can take any of a variety of form factors. Typical examples of such form factors include laptops, smart phones, small form factor personal computers, personal digital assistants, rack mount devices, standalone devices, and so on. Functionality described herein also can be embodied in peripherals or add-in cards. Such functionality can also be implemented on a circuit board among different chips or different processes executing in a single device, by way of further example.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

The invention claimed is:

1. A circuit board comprising:
 a heatsink coupled to the circuit board via a first coupling mechanism and a second coupling mechanism,
 wherein,
  the first coupling mechanism provides a first force from the heatsink and to the circuit board,
  the second coupling mechanism is positioned adjacent to the first coupling mechanism along the heatsink,
  the second coupling mechanism provides a second force from the circuit board to the heatsink, and
  the second coupling mechanism includes a resilient element positioned between the heatsink and the circuit board and abutted to the heatsink to provide the second force, the second coupling mechanism including a first end portion extending toward and through the heatsink and a second end portion extending toward the circuit board.

2. The circuit board of claim 1,
 wherein,
  the first force is an asymmetrical downward force, and
  the second force is a counter force to the asymmetrical downward force.

3. The circuit board of claim 2, wherein the asymmetrical downward force is asymmetrical relative to an application specific integrated circuit (ASIC) covered by the heatsink.

4. The circuit board of claim 2, wherein the first coupling mechanism comprises a plurality of first coupling components, and
 a partial downward force created by at least one of the plurality of first coupling components when the heatsink is coupled to the circuit board results in the asymmetrical downward force.

5. The circuit board of claim 4, wherein the second coupling mechanism is configured to create a force equal and counter to the partial downward force created by the at least one of the plurality of first coupling components.

6. The circuit board of claim 4, wherein the second coupling mechanism comprises a plurality of second coupling components.

7. The circuit board of claim 6, wherein the heatsink comprises a base having a first set of openings, through each of which one of the plurality of first coupling components penetrates downward to couple the heatsink to the circuit board.

8. The circuit board of claim 7, wherein the base further comprises a second set of openings, through each of which one of the plurality of second coupling components penetrates upward to couple the circuit board to the heatsink.

9. The circuit board of claim 8, wherein each of the second set of openings is adjacent to one of the first set of openings.

10. The circuit board of claim 1, wherein each of the first coupling mechanism and the second coupling mechanism is a spring loaded plunger.

11. A circuit board comprising:
 an integrated circuit (IC);
 a heatsink coupled to the IC;
 a first coupling mechanism secured to the heatsink, the first coupling mechanism providing a first force from the heatsink and to the circuit board; and
 a second coupling mechanism resiliently secured between the heatsink and the circuit board via a resilient element, the second coupling mechanism providing a second force from the circuit board and to the heatsink, the resilient element abutting the heatsink to provide the second force, the second coupling mechanism including a first end portion extending toward and through the heatsink and a second end portion extending toward the circuit board.

12. The circuit board of claim 11, wherein,
   the heatsink includes a first portion covering the IC and a second portion extending beyond an edge of the IC, and
   the second portion extends beyond the edge of the IC parallel to the circuit board.

13. The circuit board of claim 12, wherein the second portion is an overhang portion, which together with the first portion, provide an asymmetrical layout of the heatsink over the IC when the heatsink is coupled to the circuit board and covers the IC.

14. The circuit board of claim 13, wherein the first coupling mechanism comprises a plurality of first coupling components, at least one of the plurality of first coupling components configured to couple the overhang portion to the circuit board and generate a downward force.

15. The circuit board of claim 14, wherein the second coupling mechanism comprises at least one second coupling component configured to couple the overhang portion to the circuit board and generate an upward force equal and counter to the downward force generated by the at least one of the plurality of first coupling components.

16. The circuit board of claim 15, wherein each of the at least one second coupling component corresponds to one of the plurality of first coupling components.

17. The circuit board of claim 16, wherein each of the at least one second coupling component generates a first portion of the upward force that is equal and counter to a second portion of the downward force generated by a corresponding one of the plurality of first coupling components.

18. The circuit board of claim 16, wherein an opening through which each of the at least one second coupling component penetrates a base of the heatsink is adjacent to another opening through which a corresponding one of the plurality of first coupling components penetrates the base of the heatsink.

19. A circuit board comprising:
an integrated circuit (IC);
a heatsink coupled to the IC;
a first coupling mechanism secured to the heatsink and the circuit board, the first coupling mechanism providing a first force from the heatsink and to the circuit board; and
a second coupling mechanism resiliently secured between the heatsink and the circuit board, the second coupling mechanism providing a second force from the circuit board and to the heatsink,
wherein,
   the heatsink includes a first portion covering the IC and a second portion extending beyond an edge of the IC,
   the second portion extends beyond the edge of the IC parallel to the circuit board to define an overhang portion,
   the first coupling mechanism comprises a plurality of first coupling components, at least one of the plurality of first coupling components configured to couple the overhang portion to the circuit board and generate a downward force,
   the second coupling mechanism comprises at least one second coupling component configured to couple the overhang portion to the circuit board and generate an upward force equal and counter to the downward force generated by the at least one of the plurality of first coupling components, and
   the at least one second coupling component is a spring loaded screw.

20. The circuit board of claim 18, wherein the at least one second coupling component is a spring loaded screw comprising:
   a cylindrical rod; and
   a clip configured to hold the cylindrical rod at a first rod portion thereof extending above the base of the heatsink and prevent a separation of the at least one second coupling component from the heatsink,
wherein,
   one of a pair of springs encompasses a second rod portion of the cylindrical rod extending below the base of the heatsink and configured to generate the upward force.

* * * * *